(12) United States Patent
Krishnaswamy et al.

(10) Patent No.: US 12,467,984 B2
(45) Date of Patent: *Nov. 11, 2025

(54) SYSTEMS AND METHODS FOR TESTING CABLED INTERCONNECTS UNDER MECHANICAL STRESS

(71) Applicant: Dell Products L.P., Round Rock, TX (US)

(72) Inventors: Chandra V. Krishnaswamy, Cedar Park, TX (US); Bhyrav Mutnury, Austin, TX (US); William Andrew Smith, Round Rock, TX (US); Roshan Pai, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 190 days.

This patent is subject to a terminal disclaimer.

(21) Appl. No.: 18/454,972

(22) Filed: Aug. 24, 2023

(65) Prior Publication Data

US 2025/0067821 A1 Feb. 27, 2025

(51) Int. Cl.
*G01R 31/70* (2020.01)

(52) U.S. Cl.
CPC .................... *G01R 31/70* (2020.01)

(58) Field of Classification Search
CPC ............ G01R 1/07357; G01R 31/2884; G01R 33/07; G01R 33/0035; G01R 1/0466; G01R 27/16; G01R 27/26; G01R 29/0814; G01R 31/2863; G01R 27/28; G01R 31/309; G01R 31/318572; G01R 31/31905; G01R 31/66; G01R 31/70; G01R 1/0416; G01R 31/58; H05K 1/189; H05K 7/1427; H05K 5/0026; H05K 1/147; H05K 1/0271; H05K 1/0283; H05K 2201/10151; H05K 2201/209; H05K 3/361; H05K 2203/0271; H05K 2201/0792

See application file for complete search history.

(56) References Cited

U.S. PATENT DOCUMENTS

| | | | |
|---|---|---|---|
| 4,772,845 A * | 9/1988 | Scott ...................... | G01R 31/58 324/540 |
| 4,859,953 A * | 8/1989 | Young .................... | G01R 31/50 361/827 |
| 5,280,251 A | 1/1994 | Strangio | |

(Continued)

*Primary Examiner* — Vinh P Nguyen
(74) *Attorney, Agent, or Firm* — Jackson Walker L.L.P.

(57) ABSTRACT

A method may include transmitting first test signals to electrical pathways of a connector-cable interface between a cable and a test circuit board in the absence of and in the presence of mechanical stress applied by a mechanical stressor to the connector-cable interface, performing vector network analysis measurements for one or more electrical parameters based on resultant signals from the electrical pathways resulting from the test signals in the absence of and in the presence of mechanical stress applied by the mechanical stressor to the connector-cable interface, transmitting one or more second test signals to electrical pathways of the connector-cable interface in the presence of mechanical stress applied by the mechanical stressor to the connector-cable interface, and based on differences between the vector network analysis measurements, determining whether or not the connector-cable interface has satisfied signal integrity requirements.

21 Claims, 5 Drawing Sheets

(56) References Cited

U.S. PATENT DOCUMENTS

| | | | | |
|---|---|---|---|---|
| 5,311,440 A * | 5/1994 | Hess, Jr. | ............... | G01R 29/10 |
| | | | | 324/615 |
| 5,638,604 A * | 6/1997 | Lorocco | .................. | F41G 1/345 |
| | | | | 42/145 |
| 12,085,627 B2 * | 9/2024 | Yang | ...................... | G01R 31/08 |
| 12,199,797 B1 * | 1/2025 | Farkas | ............... | H04L 25/0272 |

* cited by examiner

SYSTEMS AND METHODS FOR TESTING CABLED INTERCONNECTS UNDER MECHANICAL STRESS

TECHNICAL FIELD

The present disclosure relates in general to information handling systems, and more particularly to systems and methods for testing cabled interconnects placed under mechanical stress, for example to evaluate signal integrity properties of the cabled interconnects.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

High-speed input/output (HSIO) digital links within information handling systems, including server systems, are often routed via cabled interconnects. Server architecture is increasingly constrained with more HSIO and other cables routed within less physical space. Evolving HSIO fabrics are becoming more sensitive to a channel's physical environment.

The increased number of cables within the relatively same volumetric space in the server will require that the cables be tightly packaged. This results in mechanical stress that is very challenging to prevent during system assembly. This stress tends to concentrate at the high-speed connector-to-wire interfaces. The stress at this point can negatively affect signal integrity due to physical miniature and elastic deformation of the connector-to-wire interface. This deformation may not be permanent and may only be present while under stress. New and evolving HSIO fabrics are increasingly sensitive to minute physical deformations that are created in these conditions.

The elastic nature of these discontinuities makes HSIO specification failure detection a challenge. Signal integrity degradation may only occur while the interconnect is under mechanical stress. Accordingly, effective approaches for testing such interconnects when placed under mechanical stress are desirable.

SUMMARY

In accordance with the teachings of the present disclosure, the disadvantages and problems associated with traditional approaches to testing cabled interconnects may be substantially reduced or eliminated.

In accordance with embodiments of the present disclosure, a system may include a mechanical stressor configured to apply mechanical stress to a cable coupled to a test circuit board via a connector-cable interface in order to cause mechanical stress upon the connector-cable interface and a controller. The controller may be configured to transmit one or more first test signals to electrical pathways of the connector-cable interface in the absence of mechanical stress applied by the mechanical stressor to the connector-cable interface, perform first vector network analysis measurements for one or more electrical parameters based on resultant signals from the electrical pathways resulting from the one or more first test signals in the absence of mechanical stress applied by the mechanical stressor to the connector-cable interface, transmit one or more second test signals to electrical pathways of the connector-cable interface in the presence of mechanical stress applied by the mechanical stressor to the connector-cable interface, perform second vector network analysis measurements for the one or more electrical parameters based on resultant signals from the electrical pathways resulting from the one or more second test signals in the presence of mechanical stress applied by the mechanical stressor to the connector-cable interface, and based on differences between the first vector network analysis measurements and the second vector network analysis measurements, determine whether or not the connector-cable interface has satisfied signal integrity requirements.

In accordance with these and other embodiments of the present disclosure, a method may include transmitting one or more first test signals to electrical pathways of a connector-cable interface between a cable and a test circuit board in the absence of mechanical stress applied by a mechanical stressor to the connector-cable interface, performing first vector network analysis measurements for one or more electrical parameters based on resultant signals from the electrical pathways resulting from the one or more first test signals in the absence of mechanical stress applied by the mechanical stressor to the connector-cable interface, transmitting one or more second test signals to electrical pathways of the connector-cable interface in the presence of mechanical stress applied by the mechanical stressor to the connector-cable interface, performing second vector network analysis measurements for the one or more electrical parameters based on resultant signals from the electrical pathways resulting from the one or more second test signals in the presence of mechanical stress applied by the mechanical stressor to the connector-cable interface, and based on differences between the first vector network analysis measurements and the second vector network analysis measurements, determining whether or not the connector-cable interface has satisfied signal integrity requirements.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to: transmit one or more first test signals to electrical pathways of a connector-cable interface between a cable and a test circuit board in the absence of mechanical stress applied by a mechanical stressor to the connector-cable interface, perform first vector network analysis measurements for one or more electrical parameters based on resultant signals from the electrical pathways resulting from the one or more first test signals in the absence of mechanical stress applied by the mechanical stressor to the connector-cable interface, transmit one or more second test signals to electrical pathways of the connector-cable interface in the presence of mechanical stress applied by the mechanical stressor to the connector-cable interface, perform second vector network analysis measurements for the one or more electrical parameters based on resultant signals from the electrical pathways resulting from the one or more second test signals in the presence of mechanical stress applied by the mechanical stressor to the connector-cable interface, and based on differences between the first vector network analysis measurements and the second vector network analysis measurements, determine whether or not the connector-cable interface has satisfied signal integrity requirements.

In accordance with these and other embodiments of the present disclosure, a system may include a mechanical stressor configured to apply mechanical stress to a cable coupled to a test circuit board via a connector-cable interface in order to cause mechanical stress upon the connector-cable interface and a controller. The controller may be configured to transmit one or more first test signals to electrical pathways of the connector-cable interface in the absence of mechanical stress applied by the mechanical stressor to the connector-cable interface, perform first measurements for one or more signal equalization parameters based on resultant signals from the electrical pathways resulting from the one or more first test signals in the absence of mechanical stress applied by the mechanical stressor to the connector-cable interface, transmit one or more second test signals to electrical pathways of the connector-cable interface in the presence of mechanical stress applied by the mechanical stressor to the connector-cable interface, perform second measurements for the one or more signal equalization parameters based on resultant signals from the electrical pathways resulting from the one or more second test signals in the presence of mechanical stress applied by the mechanical stressor to the connector-cable interface, and based on differences between the first measurements and the second measurements, determine whether or not the connector-cable interface has satisfied signal integrity requirements.

In accordance with these and other embodiments of the present disclosure, a method may include transmitting one or more first test signals to electrical pathways of a connector-cable interface between a cable and a test circuit board in the absence of mechanical stress applied by a mechanical stressor to the connector-cable interface, performing first measurements for one or more signal equalization parameters based on resultant signals from the electrical pathways resulting from the one or more first test signals in the absence of mechanical stress applied by the mechanical stressor to the connector-cable interface, transmitting one or more second test signals to electrical pathways of the connector-cable interface in the presence of mechanical stress applied by the mechanical stressor to the connector-cable interface, performing second measurements for the one or more signal equalization parameters based on resultant signals from the electrical pathways resulting from the one or more second test signals in the presence of mechanical stress applied by the mechanical stressor to the connector-cable interface, and based on differences between the first measurements and the second measurements, determining whether or not the connector-cable interface has satisfied signal integrity requirements.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to: transmit one or more first test signals to electrical pathways of a connector-cable interface between a cable and a test circuit board in the absence of mechanical stress applied by a mechanical stressor to the connector-cable interface, perform first measurements for one or more signal equalization parameters based on resultant signals from the electrical pathways resulting from the one or more first test signals in the absence of mechanical stress applied by the mechanical stressor to the connector-cable interface, transmit one or more second test signals to electrical pathways of the connector-cable interface in the presence of mechanical stress applied by the mechanical stressor to the connector-cable interface, perform second measurements for the one or more signal equalization parameters based on resultant signals from the electrical pathways resulting from the one or more second test signals in the presence of mechanical stress applied by the mechanical stressor to the connector-cable interface, and based on differences between the first measurements and the second measurements, determine whether or not the connector-cable interface has satisfied signal integrity requirements.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, air movers, sensors, power supplies, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
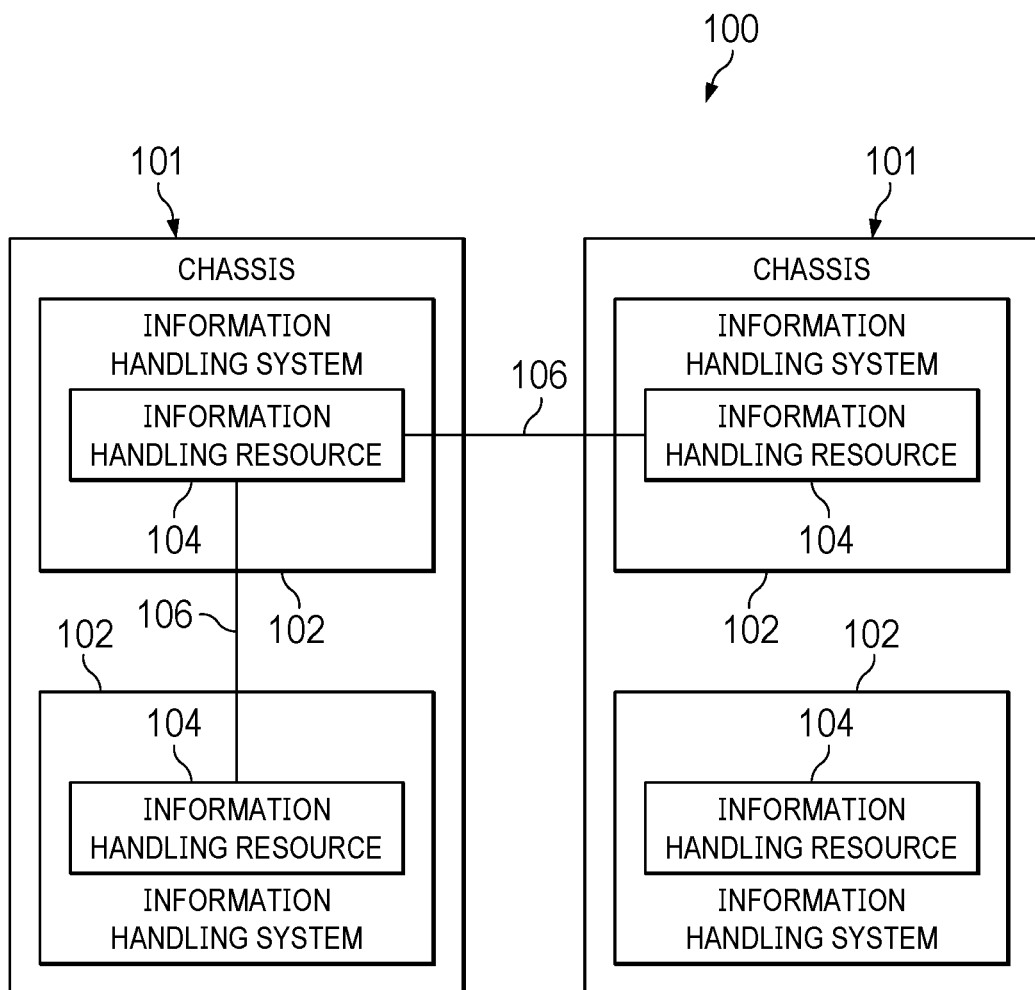
FIG. 1 illustrates a system comprising a plurality of chassis, each chassis comprising at least one information handling system, in accordance with embodiments of the present disclosure.

FIG. 1 illustrates a system 100 comprising a plurality of chassis 101, each chassis 101 comprising at least one information handling system 102, in accordance with embodiments of the present disclosure. Each chassis 101 may be an enclosure that serves as a container for various information handling systems 102 and information handling resources 104, and may be constructed from steel, aluminum, plastic, and/or any other suitable material. Although the term "chassis" is used, a chassis 101 may also be referred to as a case, cabinet, tower, box, enclosure, and/or housing. In certain embodiments, a chassis 101 may be configured to hold and/or provide power to one or more information handling systems 102 and/or information handling resources 104.

In some embodiments, one or more of information handling systems 102 may comprise servers. For example, in some embodiments, information handling systems 102 may comprise rack servers and each chassis 101 may comprise a rack configured to house such rack servers. As shown in FIG. 1, each information handling system 102 may include one or more information handling resources 104. An information handling resource 104 may include any component system, device or apparatus of an information handling system 102, including without limitation processors, service processors, basic input/output systems, buses, memories, I/O devices and/or interfaces, storage resources, network interfaces, motherboards, air movers, sensors, power supplies, and/or any other components and/or elements of an information handling system. For example, in some embodiments, an information handling resource 104 of an information handling system 102 may comprise a processor. Such processor may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, a processor may interpret and/or execute program instructions and/or process data stored in a memory and/or another information handling resource of an information handling system 102.

In these and other embodiments, an information handling resource 104 of an information handling system 102 may comprise a memory. Such a memory may be communicatively coupled to an associated processor and may include any system, device, or apparatus configured to retain program instructions and/or data for a period of time (e.g., computer-readable media). A memory may include RAM, EEPROM, a PCMCIA card, flash memory, magnetic storage, opto-magnetic storage, or any suitable selection and/or array of volatile or non-volatile memory that retains data after power to an associated information handling system 102 is turned off.

In addition to a processor and/or a memory, an information handling system 102 may include one or more other information handling resources.

Each information handling resource 104 that couples to a cable 106 may include a connector for electrically and mechanically coupling the information handling resource 104 to the cable 106. Such connector may comprise, for example, a receptacle connector for receiving a corresponding connector that terminates cable 106. As another example, such connector may comprise an interface for direct soldering of wires of cable 106 to pads, traces, or other electrical conduits of a circuit board that implements information handling resource 104. In any event, the coupling of cable 106 to information handling resource 104 creates a connector-to-cable interface wherein mechanical stress applied to a cable may in turn cause mechanical stress to the connector-to-cable interface that may affect signal integrity of electrical and electronic signals communicated via the connector-to-cable interface.

Figure 2:
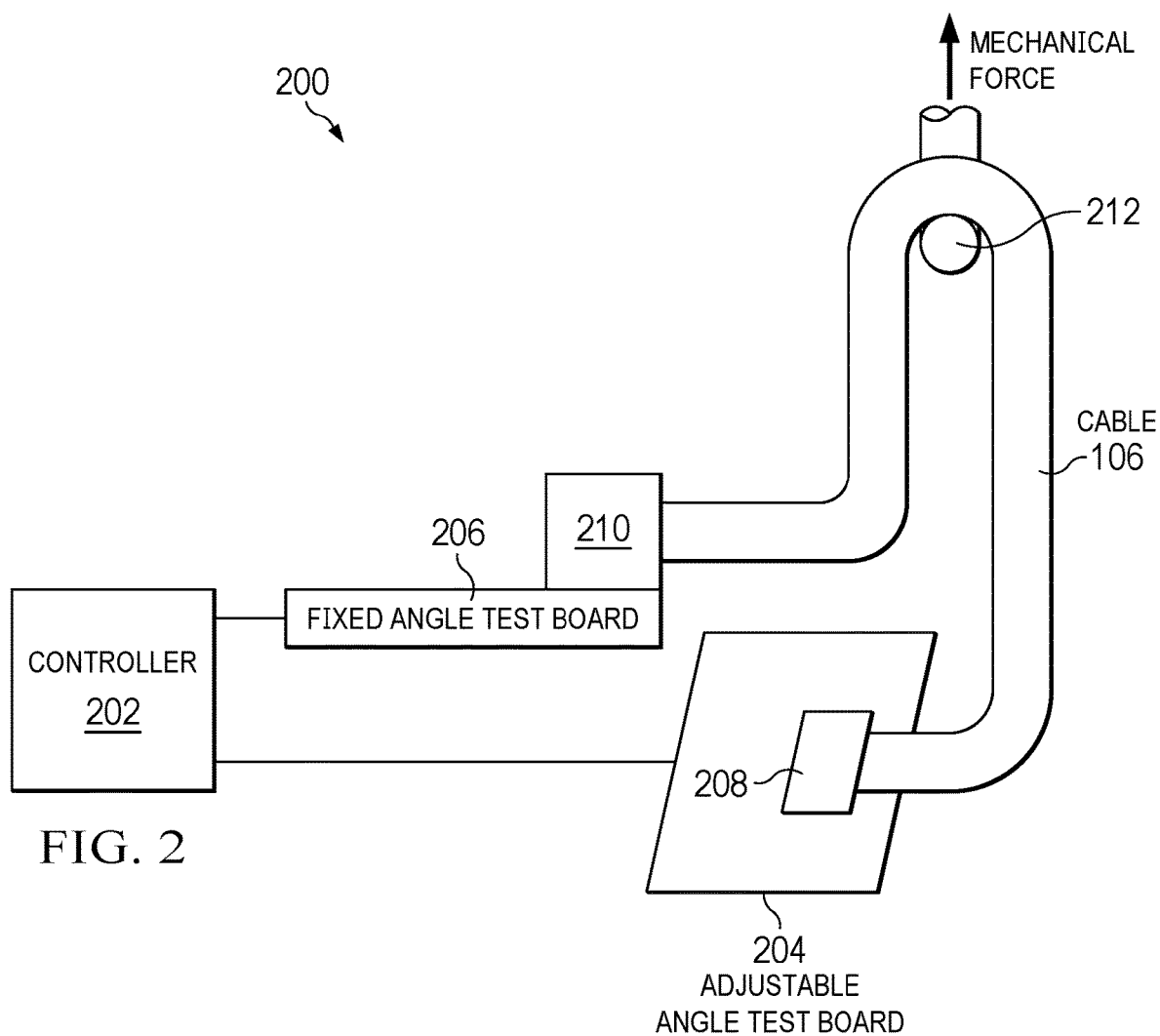
FIG. 2 illustrates a system for testing a cabled interconnect under mechanical stress, in accordance with embodiments of the present disclosure.

FIG. 2 illustrates a system 200 for testing a cabled interconnect under mechanical stress, in accordance with embodiments of the present disclosure. In some embodiments, all or some portions of system 200 may be implemented by or within an information handling system 102. As shown in FIG. 2, system 200 may include a controller 202, an adjustable angle test board 204 communicatively coupled to controller 202, a fixed angle test board 206 communicatively coupled to controller 202, a cable 106 coupled to adjustable angle test board 204 via connector 208 located on adjustable angle test board 204 and coupled to fixed angle test board 206 via connector 210 located on fixed angle test board 206, and a mechanical stressor 212.

Controller 202 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. As described in greater detail below, controller 202 may be configured to communicate one or more test signals to electrical pathways formed by adjustable angle test board 204, connector 208, cable 106, connector 210, and fixed angle test board 206, and receive one or more resultant signals from such electrical pathways, such one or more resultant signals affected by electrical parameters of adjustable angle test board 204, connector 208, cable 106, connector 210, and fixed angle test board 206. In some embodiments, controller 202 may be configured to process such one or more resultant signals in order to analyze the signal integrity in response to mechanical stress upon the connector-to-cable interface of connector 208 and cable 106. As a particular example, in a passive test of signal integrity performance in response to mechanical stress, controller 202 may comprise a vector network analyzer configured to generate test signals that sweep through a particular range of frequencies (e.g., 0 to 40 GHz). As another particular example, in an active test of signal integrity performance in response to mechanical stress, controller 202 may comprise a transmitter/receiver configured to monitor signal equalization parameters.

Adjustable angle test board 204 may comprise a circuit board including one or more electrical conduits (e.g., pads, traces, vias) for enabling conduction of electrical signals between controller 202 and cable 106 via adjustable angle test board 204 and connector 208. As its name suggests, the mechanical orientation of adjustable angle test board 204 relative to other components of system 200 may be configurable, as described in greater detail below, in order to facilitate testing of signal integrity in response to mechanical stress upon the connector-to-cable interface of connector 208 and cable 106. Connector 208 may comprise any suitable system, device, or apparatus for electrically coupling wires of cable 106 to adjustable angle test board 204, including without limitation a receptacle connector or interface for direct soldering of wires of cable 106 to pads, traces, or other electrical conduits of adjustable angle test board 204.

Fixed angle test board 206 may comprise a circuit board including one or more electrical conduits (e.g., pads, traces, vias) for enabling conduction of electrical signals between controller 202 and cable 106 via fixed angle test board 206 and connector 210. As its name suggests, the mechanical orientation of fixed angle test board 206 relative to other components of system 200 may be fixed. Connector 210 may comprise any suitable system, device, or apparatus for electrically coupling wires of cable 106 to fixed angle test board 206, including without limitation a receptacle connector or interface for direct soldering of wires of cable 106 to pads, traces, or other electrical conduits of fixed angle test board 206.

Mechanical stressor 212 may include any system, device, or apparatus configured to apply a desired mechanical stress to cable 106, which in turn may apply mechanical stress to the connector-to-cable interface of connector 208 and cable 106, thus simulating actual mechanical stresses that may be placed upon the connector-to-cable interface in real-world scenarios, particularly systems with densely-packed cables and/or components. As an example, in some embodiments, mechanical stressor 212 may comprise a mechanical hook mechanically coupled to a motor for translating a position of the mechanical hook such that the mechanical hook engages with cable 106 to apply the desired mechanical stress to cable 106. In some embodiments, operation of mechanical stressor 212 may be under the control of controller 202 or another control system.

Figure 3A:
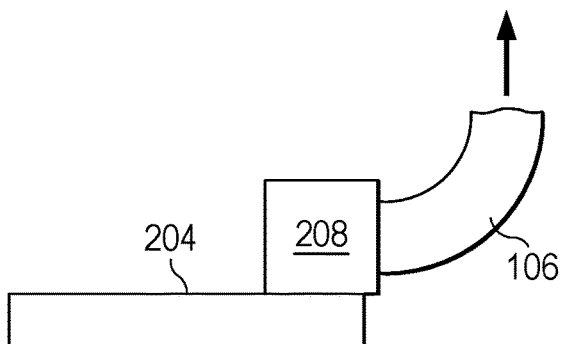
FIG. 3A illustrates application of an upward stress on a cabled interconnect in the system shown in FIG. 2, in accordance with embodiments of the present disclosure.
Figure 3B:
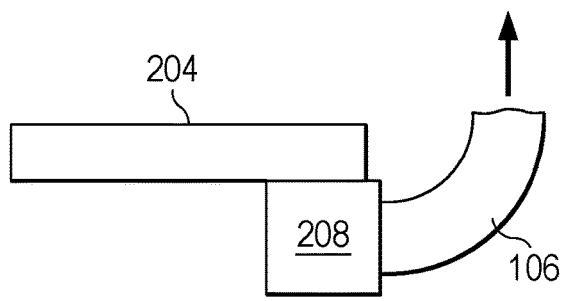
FIG. 3B illustrates application of a downward stress on a cabled interconnect in the system shown in FIG. 2, in accordance with embodiments of the present disclosure.

The adjustability of the orientation of adjustable angle test board 204 may enable mechanical stressor 212 to apply stress to the connector-to-cable interface of connector 208 and cable 106 in various directions. For example, as shown in FIG. 3A, in a first mechanical orientation of adjustable angle test board 204, mechanical stressor 212 may apply an upward mechanical stress on the connector-to-cable interface in a direction perpendicular to the surface of adjustable angle test board 204 upon which connector 208 is located in a direction away from such surface. As another example, as shown in FIG. 3B, in a second mechanical orientation of adjustable angle test board 204, mechanical stressor 212 may apply a downward mechanical stress on the connector-to-cable interface in a direction perpendicular to the surface of adjustable angle test board 204 upon which connector 208 is located in a direction towards such surface (e.g., opposite the direction of that shown in FIG. 3A).

Figure 3C:
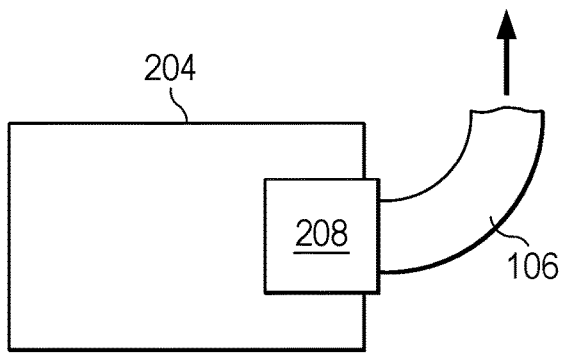
FIG. 3C illustrates application of a left-ward stress on a cabled interconnect in the system shown in FIG. 2, in accordance with embodiments of the present disclosure.
Figure 3D:
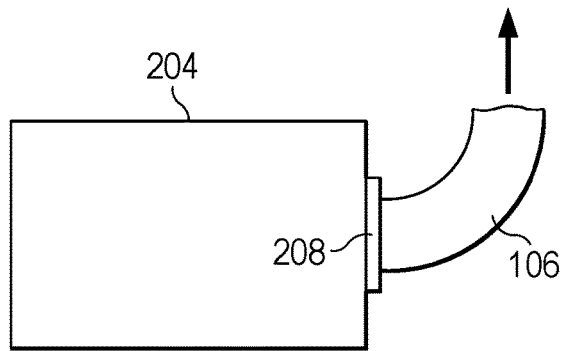
FIG. 3D illustrates application of a right-ward stress on a cabled interconnect in the system shown in FIG. 2, in accordance with embodiments of the present disclosure.
Figure 3E:
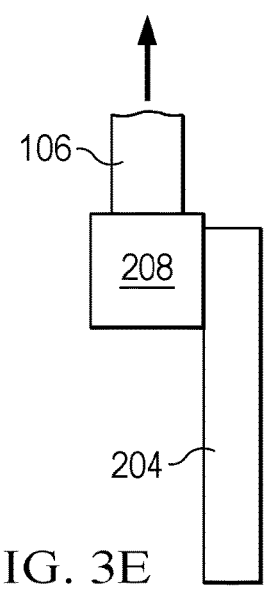
FIG. 3E illustrates application of an axial stress on a cabled interconnect in the system shown in FIG. 2, in accordance with embodiments of the present disclosure.

As a further example, as shown in FIG. 3C, in a third mechanical orientation of adjustable angle test board 204, mechanical stressor 212 may apply a left-ward mechanical stress on the connector-to-cable interface in a direction parallel to the surface of adjustable angle test board 204 upon which connector 208 is located. As yet another example, as shown in FIG. 3D, in a fourth mechanical orientation of adjustable angle test board 204, mechanical stressor 212 may apply a right-ward mechanical stress on the connector-to-cable interface in a direction parallel to the surface of adjustable angle test board 204 upon which connector 208 is located and opposite to the direction of FIG. 3C. As yet a further example, as shown in FIG. 3E, in a fifth mechanical orientation of adjustable angle test board 204, mechanical stressor 212 may apply an axial mechanical stress on the connector-to-cable interface in a direction along the axis of cable 106, parallel to the surface of adjustable angle test board 204 upon which connector 208 is located and parallel to the directions of FIGS. 3C and 3D.

Figure 4:
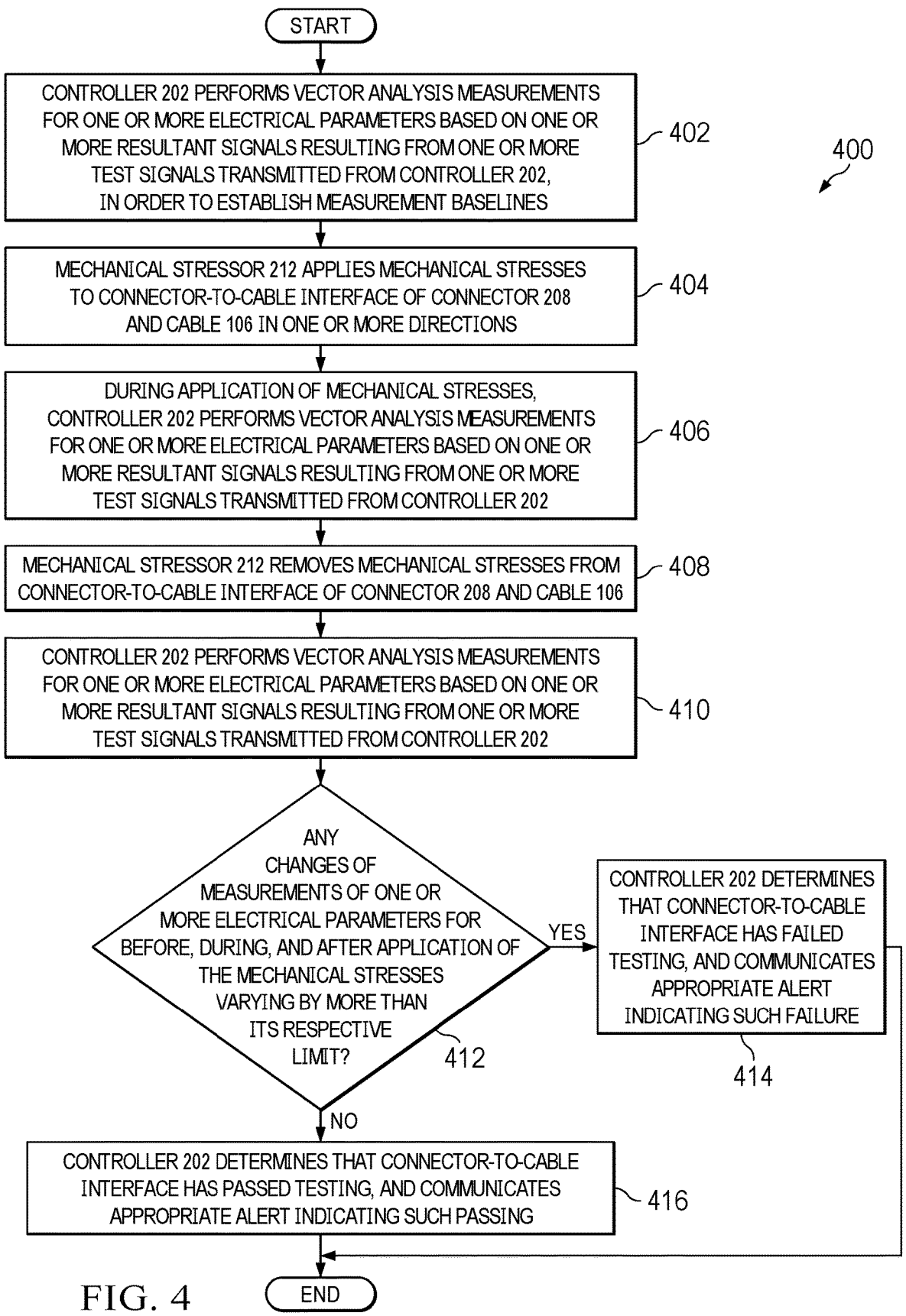
FIG. 4 illustrates a flow chart of an example method for passive testing of a cabled interconnect under mechanical stress, in accordance with embodiments of the present disclosure.

FIG. 4 illustrates a flow chart of an example method 400 for passive testing of a cabled interconnect under mechanical stress, in accordance with embodiments of the present disclosure. According to some embodiments, method 400 may begin at step 402. As noted above, teachings of the present disclosure may be implemented in a variety of configurations of information handling system 102. As such, the preferred initialization point for method 400 and the order of the steps comprising method 400 may depend on the implementation chosen.

At step 402, controller 202 may perform vector network analysis measurements for one or more electrical parameters based on one or more resultant signals resulting from one or more test signals transmitted from controller 202, in order to establish measurement baselines. For example, such one or more electrical parameters may include inductance, resistance, capacitance, phase, and/or crosstalk. At step 404, mechanical stressor 212 may apply mechanical stresses to the connector-to-cable interface of connector 208 and cable 106 in one or more directions, as described above. At step 406, during the application of the mechanical stresses, controller 202 may again perform vector network analysis measurements for one or more electrical parameters based on one or more resultant signals resulting from one or more test signals transmitted from controller 202. In some embodiments, a different untested adjustable angle test board 204 may be used for each direction stress is applied, to avoid cumulative effects of testing in other directions on the measurement of the one or more electrical parameters for a particular stress direction.

At step 408, mechanical stressor 212 may remove the mechanical stresses from the connector-to-cable interface of connector 208 and cable 106. At step 410, controller 202 may again perform vector network analysis measurements for one or more electrical parameters based on one or more resultant signals resulting from one or more test signals transmitted from controller 202.

At step 412, controller 202 may compare the measurements of the one or more electrical parameters for before, during, and after application of the mechanical stresses and determine if any change in one or more electrical parameters varies by a respective limit corresponding to such electrical parameter. If one or more electrical parameters varies by more than its respective limit, method 400 may proceed to step 414. Otherwise, method 400 may proceed to step 416.

At step 414, in response to one or more electrical parameters varying by more than its respective limit, controller 202 may determine that the connector-to-cable interface has failed testing of signal integrity requirements, and communicate an appropriate alert indicating such failure. After completion of step 414, method 400 may end.

At step 416, in response to none of the one or more electrical parameters varying by more than its respective limit, controller 202 may determine that the connector-to-cable interface has passed testing of signal integrity requirements, and communicate an appropriate alert indicating such passing. After completion of step 416, method 400 may end.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using information handling system 102 and/or any other system operable to implement method 400. In certain embodiments, method 400 may be implemented partially or fully in software and/or firmware embodied in computer-readable media.

Figure 5:
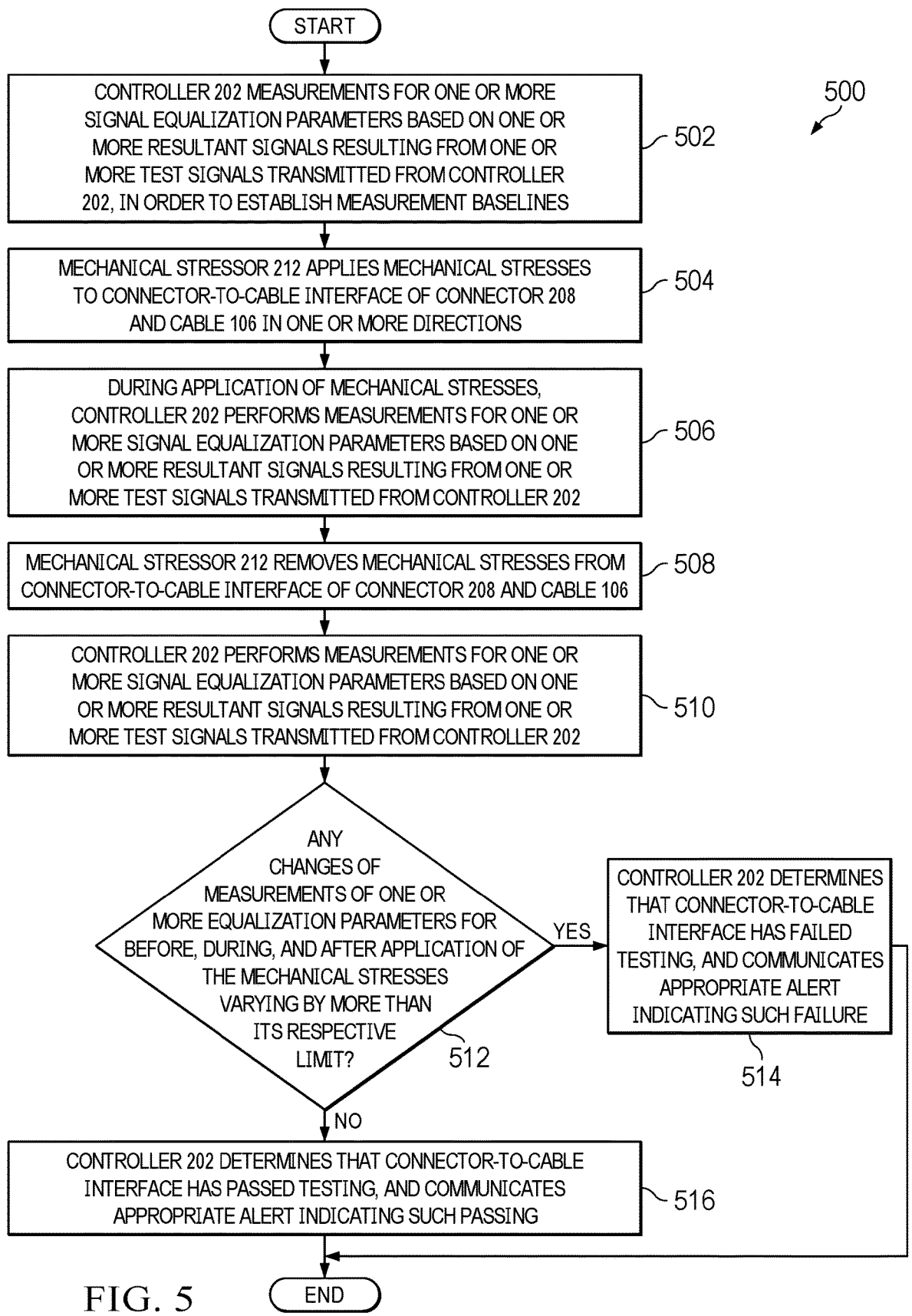
FIG. 5 illustrates a flow chart of an example method for active testing of a cabled interconnect under mechanical stress, in accordance with embodiments of the present disclosure.

FIG. 5 illustrates a flow chart of an example method 500 for active testing of a cabled interconnect under mechanical stress, in accordance with embodiments of the present disclosure. According to some embodiments, method 500 may begin at step 502. As noted above, teachings of the present disclosure may be implemented in a variety of configurations of information handling system 102. As such, the preferred initialization point for method 500 and the order of the steps comprising method 500 may depend on the implementation chosen.

At step 502, controller 202 may perform measurements for one or more signal equalization parameters based on one or more resultant signals resulting from one or more test signals transmitted from controller 202, in order to establish measurement baselines. For example, such one or more signal equalization parameters may include a continuous time linear equalization parameter, a feed forward equalization parameter, a decision feedback equalization parameter, and/or any other suitable signal equalization parameters. At step 504, mechanical stressor 212 may apply mechanical stresses to the connector-to-cable interface of connector 208 and cable 106 in one or more directions, as described above. At step 506, during the application of the mechanical stresses, controller 202 may again perform measurements for one or more signal equalization parameters based on one or more resultant signals resulting from one or more test signals transmitted from controller 202. In some embodiments, a different untested adjustable angle test board 204 may be used for each direction stress is applied, to avoid cumulative effects of testing in other directions on the measurement of the one or more signal equalization parameters for a particular stress direction.

At step 508, mechanical stressor 212 may remove the mechanical stresses from the connector-to-cable interface of connector 208 and cable 106. At step 510, controller 202 may again perform measurements for one or more signal equalization parameters based on one or more resultant signals resulting from one or more test signals transmitted from controller 202.

At step 512, controller 202 may compare the measurements of the one or more signal equalization parameters for before, during, and after application of the mechanical stresses and determine if any change in one or more signal equalization parameters varies by a respective limit corresponding to such signal equalization parameter. If one or more signal equalization parameters varies by more than its respective limit, method 500 may proceed to step 514. Otherwise, method 500 may proceed to step 516.

At step 514, in response to one or more signal equalization parameters varying by more than its respective limit, controller 202 may determine that the connector-to-cable interface has failed testing of signal integrity requirements, and communicate an appropriate alert indicating such failure. After completion of step 514, method 500 may end.

At step 516, in response to none of the one or more signal equalization parameters varying by more than its respective limit, controller 202 may determine that the connector-to-cable interface has passed testing of signal integrity requirements, and communicate an appropriate alert indicating such passing. After completion of step 516, method 500 may end.

Although FIG. 5 discloses a particular number of steps to be taken with respect to method 500, method 500 may be executed with greater or fewer steps than those depicted in FIG. 5. In addition, although FIG. 5 discloses a certain order of steps to be taken with respect to method 500, the steps comprising method 500 may be completed in any suitable order.

Method 500 may be implemented using information handling system 102 and/or any other system operable to implement method 500. In certain embodiments, method 500 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system, comprising:
a mechanical stressor configured to apply mechanical stress to a cable coupled to a test circuit board via a connector-cable interface in order to cause mechanical stress upon the connector-cable interface; and
a controller configured to:
transmit one or more first test signals to electrical pathways of the connector-cable interface in the absence of mechanical stress applied by the mechanical stressor to the connector-cable interface;
perform first vector network analysis measurements for one or more electrical parameters based on resultant signals from the electrical pathways resulting from the one or more first test signals in the absence of mechanical stress applied by the mechanical stressor to the connector-cable interface;
transmit one or more second test signals to electrical pathways of the connector-cable interface in the presence of mechanical stress applied by the mechanical stressor to the connector-cable interface;
perform second vector network analysis measurements for the one or more electrical parameters based on resultant signals from the electrical pathways resulting from the one or more second test signals in the presence of mechanical stress applied by the mechanical stressor to the connector-cable interface; and
based on differences between the first vector network analysis measurements and the second vector network analysis measurements, determine whether or not the connector-cable interface has satisfied signal integrity requirements.

2. The system of claim 1, wherein one or more electrical parameters comprise one or more of resistance, inductance, capacitance, phase, and crosstalk associated with the electrical pathways.

3. The system of claim 1, wherein:
the mechanical stressor is configured to apply multiple mechanical stresses to the cable to cause mechanical stress upon the connector-cable interface in a plurality of different directions; and
the controller is configured to execute the transmission steps, the performing steps, and the determining step for each of the plurality of different directions.

4. The system of claim 3, wherein the controller is configured to execute the transmission steps, the performing steps, and the determining step on a different test circuit board for each of the plurality of different directions.

5. The system of claim 1, wherein the controller is configured to transmit the one or more first test signals and perform first vector network analysis measurements prior to the presence of mechanical stress applied by the mechanical stressor to the connector-cable interface.

6. The system of claim 1, wherein the controller is configured to transmit the one or more first test signals and perform first vector network analysis measurements after removal of mechanical stress applied by the mechanical stressor to the connector-cable interface.

7. The system of claim 1, wherein the controller is further configured to:
transmit one or more third test signals to electrical pathways of the connector-cable interface in the absence of mechanical stress applied by the mechanical stressor to the connector-cable interface and after removal of mechanical stress applied by the mechanical stressor to the connector-cable interface;
perform third vector network analysis measurements for one or more electrical parameters based on resultant signals from the electrical pathways resulting from the one or more third test signals in the absence of mechanical stress applied by the mechanical stressor to the connector-cable interface;
transmit the one or more first test signals and perform first vector network analysis measurements prior to the presence of mechanical stress applied by the mechanical stressor to the connector-cable interface; and based on comparisons among the first vector network analysis measurements, the second vector network analysis measurements, and the third vector network analysis measurements, determine whether or not the connector-cable interface has satisfied signal integrity requirements.

8. A method, comprising:
transmitting one or more first test signals to electrical pathways of a connector-cable interface between a cable and a test circuit board in the absence of mechanical stress applied by a mechanical stressor to the connector-cable interface;
performing first vector network analysis measurements for one or more electrical parameters based on resultant signals from the electrical pathways resulting from the one or more first test signals in the absence of mechanical stress applied by the mechanical stressor to the connector-cable interface;
transmitting one or more second test signals to electrical pathways of the connector-cable interface in the presence of mechanical stress applied by the mechanical stressor to the connector-cable interface;
performing second vector network analysis measurements for the one or more electrical parameters based on resultant signals from the electrical pathways resulting from the one or more second test signals in the presence of mechanical stress applied by the mechanical stressor to the connector-cable interface; and
based on differences between the first vector network analysis measurements and the second vector network analysis measurements, determining whether or not the connector-cable interface has satisfied signal integrity requirements.

9. The method of claim 8, wherein one or more electrical parameters comprise one or more of resistance, inductance, capacitance, phase, and crosstalk associated with the electrical pathways.

10. The method of claim 8, wherein the mechanical stressor is configured to apply multiple mechanical stresses to the cable to cause mechanical stress upon the connector-cable interface in a plurality of different directions, and the method comprises executing the transmission steps, the performing steps, and the determining step for each of the plurality of different directions.

11. The method of claim 10, further comprising executing the transmission steps, the performing steps, and the determining step on a different test circuit board for each of the plurality of different directions.

12. The method of claim 8, further comprising transmitting the one or more first test signals and performing first vector network analysis measurements prior to the presence of mechanical stress applied by the mechanical stressor to the connector-cable interface.

13. The method of claim 8, further comprising transmitting the one or more first test signals and performing first vector network analysis measurements after removal of mechanical stress applied by the mechanical stressor to the connector-cable interface.

14. The method of claim 8, further comprising:
transmitting one or more third test signals to electrical pathways of the connector-cable interface in the absence of mechanical stress applied by the mechanical stressor to the connector-cable interface and after removal of mechanical stress applied by the mechanical stressor to the connector-cable interface;
performing third vector network analysis measurements for one or more electrical parameters based on resultant signals from the electrical pathways resulting from the one or more third test signals in the absence of mechanical stress applied by the mechanical stressor to the connector-cable interface;
transmitting the one or more first test signals and performing first vector network analysis measurements prior to the presence of mechanical stress applied by the mechanical stressor to the connector-cable interface; and
based on comparisons among the first vector network analysis measurements, the second vector network analysis measurements, and the third vector network analysis measurements, determining whether or not the connector-cable interface has satisfied signal integrity requirements.

15. An article of manufacture comprising:
a non-transitory computer-readable medium; and
computer-executable instructions carried on the computer-readable medium, the instructions readable by a processor, the instructions, when read and executed, for causing the processor to:
transmit one or more first test signals to electrical pathways of a connector-cable interface between a cable and a test circuit board in the absence of mechanical stress applied by a mechanical stressor to the connector-cable interface;
perform first vector network analysis measurements for one or more electrical parameters based on resultant signals from the electrical pathways resulting from the one or more first test signals in the absence of mechanical stress applied by the mechanical stressor to the connector-cable interface;
transmit one or more second test signals to electrical pathways of the connector-cable interface in the presence of mechanical stress applied by the mechanical stressor to the connector-cable interface;
perform second vector network analysis measurements for the one or more electrical parameters based on resultant signals from the electrical pathways resulting from the one or more second test signals in the presence of mechanical stress applied by the mechanical stressor to the connector-cable interface; and
based on differences between the first vector network analysis measurements and the second vector network analysis measurements, determine whether or not the connector-cable interface has satisfied signal integrity requirements.

16. The article of claim 15, wherein one or more electrical parameters comprise one or more of resistance, inductance, capacitance, phase, and crosstalk associated with the electrical pathways.

17. The article of claim 15, wherein the mechanical stressor is configured to apply multiple mechanical stresses to the cable to cause mechanical stress upon the connector-cable interface in a plurality of different directions, and the instructions are for further causing the processor to execute the transmission steps, the performing steps, and the determining step for each of the plurality of different directions.

18. The article of claim 17, the instructions for further causing the processor to execute the transmission steps, the performing steps, and the determining step on a different test circuit board for each of the plurality of different directions.

19. The article of claim 15, the instructions for further causing the processor to transmit the one or more first test signals and perform first vector network analysis measurements prior to the presence of mechanical stress applied by the mechanical stressor to the connector-cable interface.

20. The article of claim 15, the instructions for further causing the processor to transmit the one or more first test signals and perform first vector network analysis measurements after removal of mechanical stress applied by the mechanical stressor to the connector-cable interface.

21. The article of claim 15, the instructions for further causing the processor to:
- transmit one or more third test signals to electrical pathways of the connector-cable interface in the absence of mechanical stress applied by the mechanical stressor to the connector-cable interface and after removal of mechanical stress applied by the mechanical stressor to the connector-cable interface;
- perform third vector network analysis measurements for one or more electrical parameters based on resultant signals from the electrical pathways resulting from the one or more third test signals in the absence of mechanical stress applied by the mechanical stressor to the connector-cable interface;
- transmit the one or more first test signals and perform first vector network analysis measurements prior to the presence of mechanical stress applied by the mechanical stressor to the connector-cable interface; and
- based on comparisons among the first vector network analysis measurements, the second vector network analysis measurements, and the third vector network analysis measurements, determine whether or not the connector-cable interface has satisfied signal integrity requirements.

* * * * *